United States Patent
Kim et al.

(10) Patent No.: US 9,698,366 B2
(45) Date of Patent: Jul. 4, 2017

(54) SUBSTRATE FOR ORGANIC ELECTRONIC DEVICE

(71) Applicant: LG Display Co., Ltd., Seoul (KR)

(72) Inventors: Young Eun Kim, Seoul (KR); Jong Seok Kim, Seoul (KR); Young Kyun Moon, Chungcheongbuk-do (KR); Jin Ha Hwang, Chungcheongbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/491,607

(22) Filed: Sep. 19, 2014

(65) Prior Publication Data

US 2015/0001525 A1 Jan. 1, 2015

Related U.S. Application Data

(63) Continuation of application No. PCT/KR2013/002467, filed on Mar. 25, 2013.

(30) Foreign Application Priority Data

| Mar. 23, 2012 | (KR) | 10-2012-0030249 |
| Jul. 31, 2012 | (KR) | 10-2012-0084215 |

(51) Int. Cl.
*H01L 51/52* (2006.01)
*H01L 51/00* (2006.01)
(Continued)

(52) U.S. Cl.
CPC ............ *H01L 51/5203* (2013.01); *G02B 5/02* (2013.01); *G02B 5/0221* (2013.01);
(Continued)

(58) Field of Classification Search
CPC ............. H01L 51/0021; H01L 51/5209; H01L 51/5225; H01L 51/5203; H01L 51/5268; H01L 51/5206; H01L 51/5221
See application file for complete search history.

(56) References Cited

U.S. PATENT DOCUMENTS

| 5,959,768 A | 9/1999 | Hutton |
| 7,256,062 B2 * | 8/2007 | Fukano ............ H01L 31/02161 257/E31.038 |

(Continued)

FOREIGN PATENT DOCUMENTS

| CN | 1575075 A | 2/2005 |
| CN | 101790899 A | 7/2010 |

(Continued)

OTHER PUBLICATIONS

"Complex Index of Refraction Look-up Utility", Brigham Young University (2009), http://www.photonics.byu.edu/opticalconstants.phtml.*

*Primary Examiner* — Michele Fan
(74) *Attorney, Agent, or Firm* — Dentons US LLP

(57) ABSTRACT

Provided are a substrate for an organic electronic device (OED), an organic electronic system, a method of manufacturing the system or substrate, and lighting. The substrate for an OED may be increased in durability by preventing penetration of an external material such as moisture or oxygen, and thus an organic electronic system having excellent light extraction efficiency may be formed. In addition, since the substrate may be stably attached to an encapsulating structure sealing the organic electronic system, the device may have excellent durability with respect to abrasion of an electrode layer or pressure applied from an external environment. In addition, surface hardness of an external terminal of the organic electronic system may be maintained at a suitable level.

15 Claims, 14 Drawing Sheets

(51) Int. Cl.
*H01L 51/56* (2006.01)
*H05B 33/10* (2006.01)
*G02B 5/02* (2006.01)

(52) U.S. Cl.
CPC ........ *G02B 5/0226* (2013.01); *H01L 51/0001* (2013.01); *H01L 51/0021* (2013.01); *H01L 51/0096* (2013.01); *H01L 51/5209* (2013.01); *H01L 51/5218* (2013.01); *H01L 51/5225* (2013.01); *H01L 51/5234* (2013.01); *H01L 51/5237* (2013.01); *H01L 51/5253* (2013.01); *H01L 51/5268* (2013.01); *H01L 51/5271* (2013.01); *H01L 51/5275* (2013.01); *H01L 51/56* (2013.01); *H05B 33/10* (2013.01); *H01L 2251/53* (2013.01); *H01L 2251/56* (2013.01); *Y02E 10/549* (2013.01); *Y02P 70/521* (2015.11)

(56) References Cited

U.S. PATENT DOCUMENTS

| | | | |
|---|---|---|---|
| 2008/0203908 A1* | 8/2008 | Hasegawa | H01L 51/5237 313/504 |
| 2008/0297045 A1* | 12/2008 | Cok | B82Y 20/00 313/506 |
| 2009/0206354 A1* | 8/2009 | Kitano | H01L 33/387 257/98 |
| 2010/0072482 A1 | 3/2010 | Eom et al. | |
| 2010/0171415 A1* | 7/2010 | Akamatsu | H01L 51/5012 313/504 |
| 2011/0042697 A1 | 2/2011 | Lee et al. | |
| 2012/0074452 A1* | 3/2012 | Chan | H01L 33/52 257/99 |
| 2012/0104423 A1* | 5/2012 | Kurata | H05B 33/28 257/88 |
| 2012/0241771 A1* | 9/2012 | Kato | H01L 51/5275 257/88 |
| 2012/0305966 A1* | 12/2012 | Shin | H01L 51/0096 257/98 |
| 2013/0026461 A1* | 1/2013 | Nakamura | H01L 51/5268 257/40 |
| 2013/0056711 A1* | 3/2013 | Huh | H01L 51/5275 257/40 |
| 2013/0082590 A1* | 4/2013 | Tsai | H01L 51/5268 313/504 |
| 2013/0181195 A1* | 7/2013 | Cho | H01L 51/5203 257/40 |
| 2013/0181242 A1* | 7/2013 | Cho | H01L 51/0096 257/98 |
| 2013/0234126 A1* | 9/2013 | Nakatani | H01L 27/3246 257/40 |

FOREIGN PATENT DOCUMENTS

| | | | | |
|---|---|---|---|---|
| CN | 102308407 A | 1/2012 | | |
| EP | 1445095 A1 | 8/2004 | | |
| JP | S62124796 U | 8/1987 | | |
| JP | H0798446 A | 4/1995 | | |
| JP | 1999-026156 A | 1/1999 | | |
| JP | 2003249366 A | 9/2003 | | |
| JP | 2004-022438 A | 1/2004 | | |
| JP | 2004-134099 A | 4/2004 | | |
| JP | 2004-349064 | 12/2004 | | |
| JP | 2005108678 A | 4/2005 | | |
| JP | 2005274741 A | 10/2005 | | |
| JP | 2006100042 A * | 4/2006 | | |
| JP | 2006-253106 A | 9/2006 | | |
| JP | 2006331694 A | 12/2006 | | |
| JP | 2007027140 A | 2/2007 | | |
| JP | 2007-073405 A | 3/2007 | | |
| JP | 2007-280718 A | 10/2007 | | |
| JP | 2007287486 A | 11/2007 | | |
| JP | 2009004275 A | 1/2009 | | |
| JP | 2009054424 A | 3/2009 | | |
| JP | 2009076452 A | 4/2009 | | |
| JP | 2010129184 A | 6/2010 | | |
| JP | 2011-048937 | 3/2011 | | |
| JP | WO 2011126097 A1 * | 10/2011 | ......... | H01L 51/5268 |
| KR | 10-2004-0101004 | 12/2004 | | |
| KR | 1020060068680 A | 6/2006 | | |
| KR | 10-2009-0128487 | 12/2009 | | |
| TW | 2009-04246 A | 1/2009 | | |
| TW | 201101478 A | 1/2011 | | |
| TW | 201203649 A | 1/2012 | | |
| WO | 2009-028456 A1 | 3/2009 | | |
| WO | 2010-051229 A2 | 5/2010 | | |
| WO | 2011-126097 | 10/2011 | | |
| WO | 2011-133354 A2 | 10/2011 | | |
| WO | 2011152275 A1 | 12/2011 | | |
| WO | 2012-020452 A1 | 2/2012 | | |

* cited by examiner (a)

(b)

SUBSTRATE FOR ORGANIC ELECTRONIC DEVICE

This application is a Continuation Bypass of International Application No. PCT/KR2013/002467, filed Mar. 25, 2013, and claims the benefit of Korean Application No. 10-2012-0030249, filed on Mar. 23, 2012, and Korean Application No. 10-2012-0084215, filed on Jul. 31, 2012, all of which are hereby incorporated by reference in their entirety for all purposes as if fully set forth herein.

FILED

The present application relates to a substrate for an organic electronic device (OED), an organic electronic system, a method of manufacturing the system or substrate, and lighting.

BACKGROUND

An OED is a device including at least one layer of an organic material, through which electricity can flow. Kinds of the OED may include an organic light emitting diode (OLED), an organic solar cell, an organic photo conductor (OPC), and an organic transistor.

Conventionally, an OLED, which is a representative OED, sequentially includes a substrate, a first electrode layer, an organic layer, and a second electrode layer. In a structure known as a bottom emitting device, the first electrode layer may be a transparent electrode layer, and the second electrode layer may be a reflective electrode layer. In addition, in a structure known as a top emitting device, the first electrode layer may be formed as a reflective electrode layer, and the second electrode layer may be formed as a transparent electrode layer. Electrons and holes injected by the electrode layers are recombined in the emitting layer located in the organic layer, resulting in generating light. The light may be emitted to the substrate in the bottom emitting device, or to the second electrode layer in the top emitting device. In the structure of the OLED, the indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive index, for example, the light generated in the emitting layer in the bottom emitting device is trapped at an interface between the organic layer and the first electrode layer or in the substrate due to the total internal reflection, and only a very small amount of light is emitted.

Another important factor required in the OED is durability. Since the organic layer or electrode is very easily oxidized under the influence of an external material such as moisture or oxygen, it is important to ensure the durability with respect to environmental factors. To this end, for example, patent documents 1 to 4 suggest structures capable of preventing penetration of an external material.

PRIOR ART DOCUMENTS

Patent Documents (Patent Document 1) U.S. Pat. No. 6,226,890
(Patent Document 2) U.S. Pat. No. 6,808,828
(Patent Document 3) Japanese Patent Publication No. 2000-145627
(Patent Document 4) Japanese Patent Publication No. 2001-252505

DESCRIPTION

Technical Object

The present application provides a substrate for an OED, an OED, a method of manufacturing the substrate or the OED, and lighting.

Technical Solution

Illustrative substrate for an OED may include a base layer, an optical functional layer, and an electrode layer. Here, the optical functional layer and the electrode layer may be sequentially stacked on the base layer, and thus the optical functional layer may be located between the base layer and the electrode layer. FIGS. 1 and 2 show illustrative substrates including a structure in which an optical functional layer 103 and an electrode layer 102 are sequentially formed on a base layer 101. Here, the optical functional layer may have a smaller projected area than that of base layer, and the electrode layer may have a larger projected area than that of optical functional layer. The term "projected area" as used herein may refer to an area of a projection of an object, such as the base layer, the optical functional layer, the electrode layer or an intermediate layer as described below, recognized when the substrate is observed from above along a direction parallel to a normal line of the surface of the substrate. Therefore, for example, if the surface of the optical functional layer is uneven and has a large roughness, an actual surface area of the optical functional layer may be larger than that of the electrode layer. However, in this case, if an area of the optical functional layer recognized from above is smaller than an area of the electrode layer recognized from above, it is construed that the optical functional layer has a smaller projected area than the electrode layer.

Various types of optical functional layers may be used if the optical functional layer has a smaller projected area than that of base layer, and the electrode layer. For example, the optical functional layer 103 may be formed only on a part of the base layer 101 other than an edge as shown in FIG. 1, or may partially remain at an edge of the base layer 101 as show in FIG. 2.

FIG. 3 shows the substrate of FIG. 1 when observed from above. As shown in FIG. 3, an area (A), that is, a projected area (A), of the electrode layer recognized when the optical functional layer is observed from above, is larger than a projected area (B) of the optical functional layer disposed thereunder. A ratio (A/B) of the projected area (A) of the electrode layer and the projected area (B) of the optical functional layer may be, for example, 1.04, 1.06, 1.08, 1.1, or 1.15 or more. When the projected area of the optical functional layer is smaller than that of the electrode layer, a structure in which the optical functional layer is not exposed to an external environment is possibly embodied as will be described later, and thus the upper limit of the ratio (A/B) of the projected area is not particularly limited. In consideration of a general environment of manufacturing a substrate, the upper limit of the ratio (A/B) may be, for example, approximately 2.0, 1.5, 1.4, 1.3, or 1.25. In the substrate, the electrode layer may also be formed on the top of the base layer on which the optical functional layer is not formed. The electrode layer may be formed in contact with the base layer, or may be formed by including an additional component, such as an intermediate layer to be described later, between the electrode layer and the base layer. According to such a structure, a structure in which the optical functional layer is not exposed to an external environment may be embodied during the embodiment of the OED.

For example, as shown in FIG. 3, an electrode layer may be formed in a region including a region beyond all of peripheral regions of the optical functional layer when being observed from above. In this case, for example, as shown in FIG. 2, when a plurality of optical functional layers are located on the base layer, the electrode layer may be formed up to the region including the region beyond all of the peripheral regions of at least one of the optical functional layers, for example, an optical functional layer at least on which the organic layer will be formed as to be described later. For example, in the structure of FIG. 2, when the organic layer is also formed on the top of the optical functional layer located at right and left edges thereof, the structure of FIG. 2 may be changed to form the electrode layer up to the region beyond all of the peripheral regions of the optical functional layer located at the right and left edges by being extended to left and right sides. In the above structure, a structure in which the optical functional layer is not exposed to an external environment may be formed by attaching an encapsulating structure to be described later to the electrode layer below which the optical functional layer is not formed, or forming a conductive material layer as will be described later.

A projected area of the optical functional layer is different from that of the electrode layer, and when the electrode layer is formed on the top of the base layer on which the optical functional layer is not formed, (a) resistivity of the electrode layer may be increased due to a step difference (e.g., step difference in the region represented by reference mark X in FIG. 1) at a boundary between the electrode layer (hereinafter referred to simply as the electrode layer formed on the base layer) formed on the base layer on which the optical functional layer is not formed and the electrode layer (hereinafter referred to simply as the electrode layer formed on the optical functional layer) on which the optical functional layer is formed. Such an increase in resistivity may cause an increase in voltage applied to a system when the organic electronic system is embodied using the substrate, resulting in reducing efficiency. Accordingly, in consideration of the above problem, it may be necessary to control a resistivity between the electrode layer formed on the optical functional layer and the electrode layer formed on the base on which the optical functional layer is not formed in a suitable range. For example, parallel electrodes may be formed at predetermined distances from both sides of the boundary to be parallel to the boundary between the electrode layer formed on the optical functional layer and the electrode layer formed on the base on which the optical functional layer is not formed, and a resistivity per unit width measured between the two parallel electrodes may be approximately 8.5 to 20, 8.5 to 15, 8.5 to 13 or less, or 9 to 12 Ω·cm or less. The term "resistivity per unit width" used herein refers to a value of resistivity measured by the following method. First, a sample is prepared by cutting the substrate for an OED. For example, as shown in FIG. 4, the sample may be prepared by forming a parallel electrode 401 having a vertical length (D4) of approximately 10 mm to have a horizontal length (D1+D2, D1=D2) of 3 mm based on the boundary between the electrode layer 1022 formed on the optical functional layer and the electrode layer 1021 formed on the base layer without an optical functional layer. Here, the parallel electrode may be formed of a material having a surface resistivity 10 times lower than the electrode layers 1021 and 1022 to be measured, for example, using a silver paste to have a horizontal length (D3) of approximately 3 mm or more. Subsequently, after a resistivity measurer 402 is connected to the parallel electrode 401, a resistivity per unit width may be measured using the measurer 402. That is, the resistivity per unit width is a value obtained by dividing the resistivity measured between the parallel electrodes 401 by a width between the parallel electrodes 401. Here, a length direction is a direction in which a current flows, that is, a direction vertical to a length direction of the parallel electrode, and a width direction refers to a direction parallel to the parallel electrode. Meanwhile, a difference (R1−R2) between a resistivity value (R1) per unit width measured by the above method with respect to the electrode layer having a step difference and a resistance value (R2) per unit width measured by the same method with respect to the electrode layer formed evenly without a step difference may be, for example, approximately 10, 9, 7 or 5 Ω·cm or less. It is preferable that the difference (R1−R2) in resistivity value be decreased, and the lower limit thereof is not particularly limited.

A method of controlling the resistivity between the electrode layers in the substrate in the above range is not particularly limited. As one method, for example, a method of controlling thicknesses of the optical functional layer and the electrode layer may be exemplified. Here, the thickness of the electrode layer may refer to a thickness of the electrode layer formed on the base layer without the optical functional layer. As the thicknesses of both of the electrode layers are suitably controlled, resistivity between the electrode layers may be controlled. For example, a ratio (T1/T2) between a thickness (T1) of the optical functional layer on the substrate and a thickness (T2) of the electrode layer formed on the top of the base layer without the optical functional layer may be approximately 3 to 15, 4 to 12, or 5 to 10. Here, the thicknesses of the optical functional layer and the electrode layer may refer to average thicknesses thereof, respectively. By controlling the ratio (T1/T2) suitably within the above-described range, it is possible to control the resistivity between the electrode layers.

In the substrate, the electrode layer on the base layer may have a pencil hardness of 6, 7 or 8 H or more. As will be described later, the electrode layer on the base layer may be used to form a structure in which an optical functional layer is not exposed to an external environment with an encapsulating structure, or connected to an external power in a device such as an organic electronic system. Since such an electrode layer is continuously worn out or exposed to pressure, high durability is required to embody a device having a stable electric connection. When the electrode layer on the base layer has pencil hardness in the above range, it is possible to embody a structure having excellent durability with respect to continuous abrasion or exposure to pressure. In addition, since the structure has excellent durability with respect to continuous abrasion or exposure to pressure as the pencil hardness is increased, the upper limit of the pencil hardness is not limited. Conventionally, for example, the upper limit of the pencil hardness may be approximately 10 or 9 H. In the substrate, the electrode on the optical functional layer and the electrode layer on the base layer may have different pencil hardnesses from each other. For example, in the substrate, the electrode layer on the base layer may have pencil hardness in the range, and the electrode layer on the optical functional layer may have a pencil hardness of approximately 2 B to 5 H, 1 to 5 H, or 1 to 4 H. The "pencil hardness" used herein is measured with a pencil weight of 500 g and a pencil movement speed of 250 mm/min according to ASTM D3363.

The substrate, for example, may further include a conductive material layer electrically connected with both of the electrode layers on the optical functional layer and the base layer. FIG. 5 shows an illustrative substrate further including a conductive material, in which a conductive material 501 is electrically connected with an electrode layer 1021 on a base layer and an electrode layer 1022 on an optical functional layer by physical contact. The term "electrical connection" used herein may refer to all connections such that a current flows between connected subjects. When the conductive material is formed as described above, the increase in resistivity of the electrode layer due to a step difference at the boundary between the electrode layer on the base layer and the electrode layer on the optical functional layer, may be prevented, as described above, and thus the substrate can be more freely embodied without the control in thickness of the optical functional layer and the electrode layer on the base layer described above. In addition, the structure in which the optical functional layer is not exposed to an external environment may be more effectively embodied due to the presence of the conductive material. The conductive material may be, but is not particularly limited to, any one capable of being electrically connected with the electrode layer. As the conductive material, a material used (as a material) for an electrode in various fields of electronic products may be freely applied. For example, the conductive material may be a metal electrode material such as silver (Ag), copper (Cu), nickel (Ni), molybdenum (Mo), or aluminum (Al). In the substrate, the resistivity per unit width measured in the state in which the conductive material electrically connected with the electrode layer is located, may be, for example, approximately 1 to 8.5, 1 to 8.0, or 1 to 7.7 Ω·cm. The resistivity may be measured by the same method as described above, except that it is measured in the state in which the conductive material electrically connected with the electrode layer is located.

The substrate may further include, for example, an intermediate layer located between the optical functional layer and the electrode layer. For example, the intermediate layer may have a larger projected area than that of optical functional layer, and may be formed on the top of the optical functional layer and the top of the base layer without the optical functional layer. FIG. 6 is a diagram of an illustrative substrate further including the intermediate layer 601 formed in the type as described above. The intermediate layer may reduce the step difference on the boundary between the electrode layer on the optical functional layer and the electrode layer on the base layer, which is formed by the optical functional layer, and thus the increase in resistivity of the electrode layer may be prevented. In addition, when a material having a barrier characteristic, that is, a low moisture or vapor penetrating rate, is used as the intermediate layer, the structure in which the optical functional layer is not exposed to an external environment may be more effectively embodied. The intermediate layer may be, for example, a layer having an absolute value of a difference in refractive index between the intermediate layer and the electrode layer of approximately 1, 0.7, 0.5, or 0.3 or less. When the refractive index is controlled as described above, for example, degradation in light extraction efficiency may be prevented by trapping light generated on the top of the electrode layer at an interface between the electrode layer and the intermediate layer. Here, the refractive index of the intermediate layer or the electrode layer may be a refractive index measured with respect to light having a wavelength of approximately 550 nm. A material for forming the intermediate layer may be a material having the relationship in refractive index with the electrode layer as described above, and when necessary, having a barrier characteristic. Various materials are known, and may include, for example, SiON, $TiO_2$, $SiO_2$, $Al_2O_3$, $Ta_2O_5$, $Ti_3O_5$, TiO, $ZrO_2$, $Nb_2O_5$, $CeO_2$ and ZnS. The intermediate layer may be formed using the above-described material, for example, by deposition or wet coating. A thickness of the intermediate layer may be, but is not particularly limited to, for example, approximately 10 to 100 or 20 to 80 nm. The thickness may refer to an average thickness, and for example, the intermediate layer formed on the optical functional layer may have a different thickness from that formed on the base layer.

In the substrate, a suitable material may be used as the base layer without particular limitation. For example, in a bottom emitting device, a transparent base layer, or a base layer having a transmittance with respect to light in a visible region of 50% or more may be used. The transparent base layer may be a glass base layer or a transparent polymer base layer. As the glass base layer, a base layer including soda lime glass, barium/strontium-containing glass, lead glass, alumino silicate glass, borosilicate glass, barium borosilicate glass, or quartz may be used, and as the polymer base layer, a base layer including polyimide (PI), polyethylene naphthalate (PEN), polycarbonate (PC), an acryl resin, poly (ethylene terephthalate) (PET), poly(ether sulfide) (PES), or polysulfone (PS) may be used, but the present application is not limited thereto. As needed, the base layer may be a TFT substrate having a drive TFT. When the substrate is applied to a top emitting device, the base layer may not necessarily be a transparent base layer. When necessary, a reflective layer using aluminum may be formed on a surface of the base layer. For example, as described above, when the pencil hardness of the electrode layer on the base layer needs to be maintained at a high level as described above, a base layer having strength such as a glass base layer may be used.

In the substrate, the electrode layer may be a conventional hole injection or electron injection electrode layer used to manufacture an OED.

The hole injection electrode layer may be formed using a material having, for example, a relatively high work function, and when necessary, using a transparent material. For example, the hole injection electrode layer may include a metal, an alloy, an electric conductive compound having a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag, or Cu and a highly refractive transparent material such as ZnS, $TiO_2$, or ITO.

The hole injection electrode layer may be formed by an arbitrary means such as deposition, sputtering, or chemical deposition, or an electrochemical means. In addition, as needed, the formed electrode layer may be patterned through known photolithography, or a process using a shadow mask.

The transparent electron injection electrode layer may be formed using, for example, a transparent material having a relatively low work function, and for example, a suitable one of the materials used to form the hole injection electrode layer may be used, but the present application is not limited thereto. The electron injection electrode layer may be formed using, for example, deposition or sputtering, and when necessary, may be suitably patterned.

A thickness of the electrode layer may be, but is not particularly limited to, approximately 90 to 200, 90 to 180, or 90 to 150 nm in consideration of the resistivity between the electrode layers described above.

In the substrate, the kind of optical functional layer disposed between the electrode layer and the base layer is not particularly limited. As the optical functional layer, any kind of layer located between the electrode layer and the base layer and exhibiting at least one optical function to contribute to enhancement of the function of the device such as an organic electronic system, may be used. Conventionally, such an optical functional layer may provide a pathway for moisture or vapor penetrating into the device after the embodiment of the device due to low durability with respect to the material such as moisture or vapor penetrating from an external environment, which may have a bad influence on performance of the device. However, in the structure of the substrate, due to the projected area and position of the optical functional layer or the electrode layer, or the presence of the conductive material or the intermediate layer, the structure in which the optical functional layer is not exposed to an external environment in the embodiment of the device can be embodied, and thus the device having excellent durability may be embodied.

As an example of the optical functional layer, a light scattering layer may be used. The term "light scattering layer" used herein may refer to, for example, any kind of layer formed to prevent or reduce trapping of light incident in a direction of the electrode layer at an interface between two layers of the base layer, the light scattering layer and the electrode layer, by scattering, refracting or diffracting light incident on the layer. An embodiment type of light scattering layer is not particularly limited, as long as the light scattering layer is embodied to exhibit the above-described function.

For example, the light scattering layer may include a matrix material and a scattering region. FIG. 7 shows that an illustrative light scattering layer including a scattering region 702 formed with scattering particles and a matrix material 701, is formed on a base layer 101. The term "scattering region" used herein may refer to, for example, a region in which incident light can be scattered, refracted or diffracted since it has a different refractive index from a matrix material or a surrounding material such as a planarized layer, and a suitable size. The scattering region may be, for example, particles having the above-described refractive index and size, or an empty space. For example, the scattering region may be formed using particles having a refractive index which is different from and higher or lower than that of the surrounding material. The refractive index of the scattering particles may have a difference in refractive index with the surrounding material, for example, the matrix material and/or the planarized layer, of more than 0.3, or 0.3 or more. For example, the scattering particles may have a refractive index of 1.0 to 3.5, or 1.0 to 3.0. The term "refractive index" is a refractive index measured with respect to light having a wavelength of approximately 550 nm. The refractive index of the scattering particles may be, for example, 1.0 to 1.6, or 1.0 to 1.3. In another embodiment, the refractive index of the scattering particles may be approximately 2.0 to 3.5, or 2.2 to 3.0. The scattering particles may have an average diameter of, for example, 50, 100, 500, or 1,000 nm or more. The average diameter of the scattering particles may be, for example, 10,000 nm or less. In addition, the scattering region may be formed by a space filled with air as an empty space having the same size.

The scattering particles or region may be formed in a circular, oval, polygonal or amorphous shape, but the shape thereof is not particularly limited. The scattering particles may include, for example, an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide. The scattering particles may include any one of the above-described materials, or at least two thereof. For example, as the scattering particles, particles formed in hollow particles such as hollow silica or core/shell-type particles, may be formed.

The light scattering layer may further include a matrix material maintaining a scattering region such as scattering particles. The matrix material may be formed using, for example, a material having a refractive index similar to another adjacent material such as the base layer, or a material having a higher refractive index than that of adjacent material. The matrix material may be, for example, a heat or photo curable monomeric, oligomeric, or polymeric organic material including polyimide, a caldo resin having a fluorene ring, urethane, epoxide, polyester, or acrylate, an inorganic material such as silicon oxide, silicon nitride, silicon oxynitride, or polysiloxane, or an organic/inorganic combination material.

The matrix material may include polysiloxane, poly(amic acid) or polyimide. Here, the polysiloxane may be formed by polycondensating, for example, a condensable silane compound or siloxane oligomer, and the binder may form a matrix based on a bond (Si—O) between silicon and oxygen. During the formation of the binder, the binder matrix based on the bond (Si—O) between silicon and oxygen may be formed by controlling condensation conditions during the formation of the matrix material, or some of organic groups such as an alkyl group or condensable functional groups such as an alkoxy group, may remain.

The poly(amic acid) or polyimide may have a refractive index with respect to light having a wavelength of 633 nm of, for example, approximately 1.5, 1.6, 1.65, or 1.7 or more. Such a highly refractive poly(amic acid) or polyimide may be prepared using, for example, a monomer to which a halogen atom other than fluorine, a sulfur atom or a phosphorus atom is introduced. For example, poly(amic acid) having a part capable of binding with particles such as a carboxyl group to enhance dispersion stability of the particles may be used. For example, the poly(amic acid) may be a compound including a repeating unit of Formula 1.

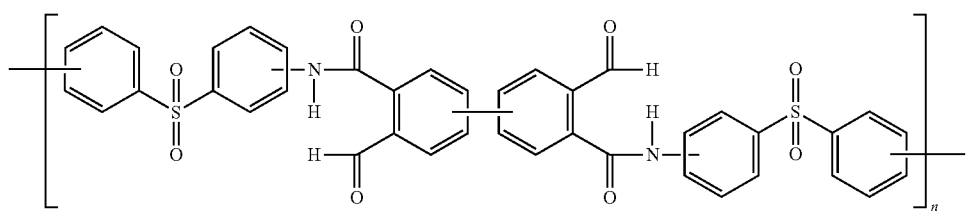

[Formula 1]

In Formula 1, n is a positive number.

The repeating unit may be optionally substituted with at least one substituent. As the substituent, a halogen atom other than fluorine, or a functional group including a halogen atom, a sulfur atom or a phosphorus atom such as a phenyl group, a benzyl group, a naphthyl group or a thiophenyl group, may be used.

The poly(amic acid) may be a homopolymer formed using only the repeating unit of Formula 1, or a block or random copolymer including another unit with the repeating unit of Formula 1. In the copolymer, the kind or ratio of another repeating unit may be suitably selected in the range in which, for example, a desired refractive index, thermal resistance or light transmittance is not inhibited.

As a particular example of the repeating unit of Formula 1, a repeating unit of Formula 2 may be used.

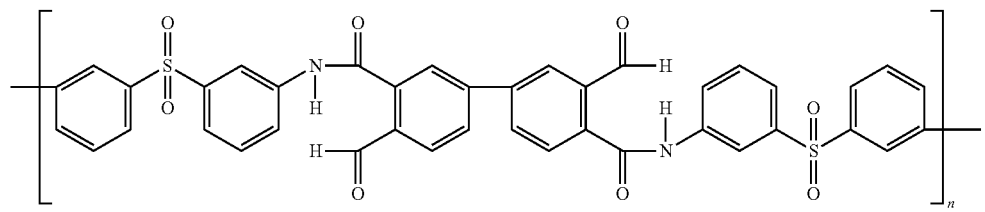

[Formula 2]

In Formula 2, n is a positive number.

The poly(amic acid) may have a weight average molecular weight converted by standard polystyrene measured by gel permeation chromatography (GPC) of approximately 10,000 to 100,000, or 10,000 to 50,000. The poly(amic acid) having the repeating unit of Formula 1 may also have light transmittance in a visible region of 80, 85, or 90% or more, and have excellent thermal resistance.

The light scattering layer may be, for example, a layer having an uneven structure. FIG. 8 is a diagram of an uneven light scattering layer 801 formed on a base layer 101. When the uneven structure of the light scattering layer is suitably controlled, incident light may be scattered. The light scattering layer having an uneven structure may be formed by, for example, coating a heat or photo curable material, and curing the material in contact with a mold capable of transferring a desired shape of the uneven structure during curing, or performing etching. Alternatively, the light scattering layer may be formed by blending particles having a suitable size and shape in a binder for forming the light scattering layer. In this case, the particles need not to be particles having a scattering function, but particles having a scattering function may also be used.

For example, the light scattering layer may be formed by coating a material by wet coating, and performing application of heat or irradiation of light, curing of the material by a sol-gel method, deposition such as chemical vapor deposition (CVD) or physical vapor deposition (PVD), nano imprinting or microembossing.

When necessary, the light scattering layer may further include highly refractive particles. The term "highly refractive particles" may refer to particles having a refractive index of, for example, 1.5, 2.0, 2.5, 2.6, or 2.7 or more. The upper limit of the refractive index of the highly refractive particles may be selected in the range capable of satisfying a desired refractive index of the light scattering layer. The highly refractive particles may have, for example, an average diameter smaller than that of the scattering particles. The highly refractive particles may have an average diameter of, for example, approximately 1 to 100, 10 to 90, 10 to 80, 10 to 70, 10 to 60, 10 to 50, or 10 to 45 nm. As the highly refractive particles, alumina, alumino silicate, a titanium oxide, or a zirconium oxide may be used. As the highly refractive particles, for example, as particles having a refractive index of 2.5 or more, rutile-type titanium oxide may be used. The rutile-type titanium oxide has a higher refractive index than other particles. Therefore, the highly refractive particles are included in the material for forming a planarized layer at a relatively small amount. The refractive index of the highly refractive particles may be measured with respect to light having a wavelength of 550 nm.

The optical function layer may be, for example, a layer including the light scattering layer and a planarized layer formed on the top of the light scattering layer. The planarized layer may be formed to have a projected area corresponding to the light scattering layer. The phrase "B having a projected area corresponding to A" used herein refers to, unless particularly defined otherwise, a case in which a projected area of A is substantially the same as that of B based on an area recognized when a substrate is observed from above. Here, "substantially the same" also includes, for example, a small difference in projected area between two regions due to a process error. For example, "substantially the same" may also include a ratio (AA/BA) between a projected area (AA) of A and a projected area (BA) of B corresponding to that of A of 0.5 to 1.5, 0.7 to 1.3, 0.85 to 1.15 or substantially 1. When the planarized layer is further included, the light scattering layer and the planarized layer may be located between the base layer and the electrode layer, a projected area of the electrode layer may be larger than those of the light scattering layer and the planarized layer, and the electrode layer may be formed also on a surface of the base layer on which the light scattering layer and the planarized layer are not formed. However, the planarized layer is not essential. For example, if the light scattering layer is planarized, the planarized layer may not be included.

For example, the planarized layer may provide a surface of the light scattering layer on which an electrode will be formed, and exhibit more excellent light extraction efficiency through interaction with the light scattering layer. The planarized layer may have, for example, the same refractive index as an adjacent electrode layer. The planarized layer may have a refractive index of, for example, approximately 1.7 or more, 1.8 to 3.5, or 2.2 to 3.0. When the planarized layer is formed on the top of the light scattering layer having an uneven structure described above, the planarized layer may be formed to have a different refractive index from the light scattering layer.

The planarized layer may be formed by, for example, a method of mixing the above-described highly refractive particles with a matrix material. The matrix material may be, for example, one described in the category of the light scattering layer.

In another embodiment, the planarized layer may be formed using a material prepared by blending a compound such as an alkoxide or acylate of a metal such as zirconium, titanium, or cerium with a binder having a polar group such as a carboxyl group or a hydroxyl group. The compound such as an alkoxide or acylate may be condensed with the polar group of the binder, and provide the metal to a backbone of the binder, thereby embodying a high refractive index. Examples of the alkoxide or acylate compound may include a titanium alkoxide such as tetra-n-butoxy titanium, tetraisopropoxy titanium, tetra-n-propoxy titanium, or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate. The planarized layer may also be formed by a sol-gel coating method including preparing a coating solution by blending a metal alkoxide such as titanium alkoxide or zirconium alkoxide with a solvent such as alcohol or water, coating the solution, and plasticizing the coated solution at a suitable temperature.

A thickness of the optical functional layer may be, but is not particularly limited to, approximately 500 to 1,000, 500 to 900, or 500 to 800 nm in consideration of the resistivity between the electrode layers described above.

Another aspect of the present application provides an organic electronic system. The illustrative organic electronic system of the present application may include the substrate for an OED described above, an organic layer formed on an electrode layer of the substrate, and an electrode layer formed on the organic layer. Hereinafter, for distinguishment, an electrode layer formed on the substrate for an OED may be referred to as a first electrode layer, and an electrode layer formed on the organic layer may be referred to as a second electrode layer. In the organic electronic system including the substrate, a projected area of the first electrode layer is larger than that of an optical functional layer of the substrate, and the electrode layer may be formed on a surface of the base layer on which the optical functional layer is not formed.

The organic layer may include at least an emitting layer. For example, when a transparent electrode layer is used as the first electrode layer and a reflective electrode layer is used as the second electrode layer, a bottom emitting device radiating light generated from an emitting layer of the organic layer to the base layer through the optical functional layer, may be embodied.

In the organic electronic system, the optical functional layer may have, for example, a projected area corresponding to an emitting region of the emitting layer, or larger than that of the emitting region. For example, a difference (B−C) between a length (B) of a region in which the optical functional layer is formed and a length (C) of the emitting region of the emitting layer may be approximately 10 μm to 2 mm. Here, the length (B) of the region in which the optical functional layer is formed is a length of the region recognized when the optical functional layer is observed from above in an arbitrary direction, and in this case, the length (C) of the emitting region may refer to a length measured in the same direction as the length (B) of the region in which the optical functional layer is formed based on the region recognized when the emitting region is observed from above. The optical functional layer may also be formed at a position corresponding to the emitting region. The phrase "the optical functional layer is formed at the position corresponding to the emitting region" may indicate that, for example, when the organic electronic system is observed from above and below, the emitting region and the optical functional layer substantially overlap.

In one embodiment, the OED may be an OLED. When the OED is an OLED, the OED may have, for example, a structure in which the organic layer including at least an emitting layer is interposed between a hole injection electrode layer and an electron injection electrode layer. For example, when the first electrode layer is a hole injection electrode layer, the second electrode layer is an electron injection electrode layer, and in contrast, when the first electrode layer is an electron injection electrode layer, the second electrode layer may be a hole injection electrode layer.

The organic layer located between the electron and hole injection electrode layers may include at least one emitting layer. The organic layer may include at least two emitting layers. When at least two emitting layers are included, the emitting layers may be separated by an inter-electrode layer having a charge generating characteristic or a charge generating layer (CGL).

The emitting layer may be formed using, for example, various fluorescent or phosphorescent organic materials known in the art. An example of the material capable of being used in the emitting layer may be, but is not limited to, a fluorescent material such as an Alq-based material such as tris(4-methyl-8-quinolinolate)aluminum(III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP); 4,4'-bis(2,2'-diphenylvinyl)-1,1'-biphenyl (DPVBi), distyryl benzene, or a derivative thereof; or 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ifr$ (bpy), $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX, or DCJTB as a dopant.

The emitting layer may be formed by employing one suitable type selected from electron accepting organic compounds and electron donating organic compounds exhibiting emitting characteristics to be described later.

The organic layer may be formed in various structures further including various functional layers known in the art as long as the emitting layer is included. The layer capable of being included in the organic layer may be an electron injection layer, a hole blocking layer, an electron transport layer, a hole transport layer or a hole injection layer.

The electron injection layer or the electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, or a derivative thereof; a metal chelate complex compound disclosed in a patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470, or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis (2-methyl-8-quinolinolato)aluminum, tris(8-quinolinolato) indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Application Laid-Open No. 1993-202011, Japanese Patent Application Laid-Open No. 1995-179394, Japanese Patent Application Laid-Open No. 1995-278124, or Japanese Patent Application Laid-Open No. 1995-228579; a triazine compound disclosed in a patent publication such as Japanese Patent Application Laid-Open No. 1995-157473; a stilbene derivative disclosed in a patent publication such as Japanese Patent Application Laid-Open No. 1994-203963; a distyrylarylene derivative; a styryl derivative disclosed in a patent publication such as Japanese Patent Application Laid-Open No. 1994-132080 or Japanese Patent Application Laid-Open No. 1994-88072; a diolefin derivative disclosed in a patent publication such as Japanese Patent Application Laid-Open No. 1994-100857 or Japanese Patent Application Laid-Open No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl) benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis [2-(4-biphenyl)vinyl]pyrazine, or 2,5-bis[2-(1-pyrenyl)vinyl]pyrazine; a dimethylidene compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl) biphenyl, or a derivative thereof; a silanamine derivative disclosed in a patent publication such as Japanese Patent Application Laid-Open No. 1994-49079 or Japanese Patent Application Laid-Open No. 1994-293778; a multifunctional styryl compound disclosed in a patent publication such as Japanese Patent Application Laid-Open No. 1994-279322 or Japanese Patent Application Laid-Open No. 1994-279323; an oxadiazole derivative disclosed in a patent publication such as Japanese Patent Application Laid-Open No. 1994-107648 or Japanese Patent Application Laid-Open No. 1994-092947; an anthracene compound disclosed in a patent publication such as Japanese Patent Application Laid-Open No. 1994-206865; an oxinate derivative disclosed in a patent publication such as Japanese Patent Application Laid-Open No. 1994-145146; a tetraphenyl butadiene compound disclosed in a patent publication such as Japanese Patent Application Laid-Open No. 1992-96990; an organic trifunctional compound disclosed in a patent publication such as Japanese Patent Application Laid-Open No. 1991-296595; a coumarin derivative disclosed in a patent publication such as Japanese Patent Application Laid-Open No. 1990-191694; a perylene derivative disclosed in a patent publication such as Japanese Patent Application Laid-Open No. 1990-196885; a naphthalene derivative disclosed in a patent publication such as Japanese Patent Application Laid-Open No. 1990-255789; a phthaloperynone derivative disclosed in a patent publication such as Japanese Patent Application Laid-Open No. 1990-289676 or Japanese Patent Application Laid-Open No. 1990-88689; or a styryl amine derivative disclosed in a patent publication such as Japanese Patent Application Laid-Open No. 1990-250292 may be used as an electron accepting organic compound included in a lowly refractive layer. In addition, here, the electron injection layer may be formed using, for example, a material such as LiF or CsF.

The hole blocking layer may be a layer capable of enhancing the life span and efficiency of the device by preventing approach of injected holes to an electron injection electrode layer through the emitting layer, and may be formed in a suitable part between the emitting layer and the electron injection electrode layer using a known material when necessary.

The hole injection layer or hole transport layer may include, for example, an electron donating organic compound. As the electron donating organic compound, N,N', N'-tetraphenyl-4,4'-diaminophenyl, N,N'-diphenyl-N,N'-di (3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4, 4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis [N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4''-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine, or 4,4''-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole), or a a-conjugated polymer of polysilane may also be used.

The hole injection layer may be formed using an electrically conductive polymer such as a metal phthalocyanine such as copper phthalocyanine, a non-metal phthalocyanine, a carbon layer, or polyaniline, or by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/ an insulating layer/a hole injection layer/a hole transport layer/an organic emitting layer/an electron injection layer/an electron injection electrode layer, which are sequentially formed, and in some cases, the OLED may have an organic layer having a structure in which at least two emitting layers are divided by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer, and methods of forming the same are known in the art, and all of the above-described methods may be applied to manufacture the organic electronic system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or metal can, or a film covering an entire surface of the organic layer.

FIG. 9 shows that an organic layer 901 and a second electrode layer 902 formed on a substrate including a base layer 101, an optical functional layer 103 and a first electrode layer 102, which are sequentially formed, are protected by an encapsulating structure 903 having a can structure, such as a glass can or a metal can. As shown in FIG. 9, the encapsulating structure 903 may be attached to the substrate by an adhesive 904. For example, the encapsulating structure may be adhered to the electrode layer below which an optical functional layer is not located in the substrate. For example, the encapsulating structure 903 as shown in FIG. 9 may be attached to an end of the substrate by the adhesive 904. In such a method, a protecting effect through the encapsulating structure may be maximized.

The encapsulating structure may be, for example, a film coating entire surfaces of the organic layer and the second electrode layer. FIG. 10 shows an encapsulating structure 1001 formed in a film type covering entire surfaces of the organic layer 901 and the second electrode layer 902. For example, as shown in FIG. 10, the film-type encapsulating structure 1001 may have a structure which coats entire surfaces of the organic layer 901 and the second electrode layer 902, and in which a substrate including a base layer 101, an optical functional layer 103 and an electrode layer 102 is adhered to a second substrate 1002 disposed thereon. Here, the second substrate 1002 may be, for example, a glass substrate, a metal substrate, a polymer film, or a barrier layer. The film-type encapsulating structure may be formed by, for example, coating a liquid material cured by heat or UV irradiation such as an epoxy resin, and curing the coated material, or laminating the substrate and the upper substrate using an adhesive sheet previously manufactured in a film type using the epoxy resin.

The encapsulating structure may include a water adsorbent or a getter such as a metal oxide such as calcium oxide or beryllium oxide, a metal halide such as calcium chloride, or phosphorus pentoxide as needed. For example, the water adsorbent or getter may be included in a film-type encapsulating structure, or located at a predetermined position of a can-type encapsulating structure. The encapsulating structure may further include a barrier film or conductive film.

For example, as shown in FIG. 9 or 10, the encapsulating structure may be attached to the top of the first electrode layer below which the optical functional layer is not formed. Thus, a sealing structure in which the optical functional layer is not exposed to an external environment, may be embodied. The sealing structure may refer to, for example, a state in which an entire surface of the optical functional layer is surrounded by the base layer, the electrode layer, and/or the encapsulating structure, or by the sealing structure formed to include the base layer, the electrode layer, and/or the encapsulating structure, thereby preventing exposure of the optical function layer to an external environment. The sealing structure may include only the base layer, the electrode layer, and/or the encapsulating structure, or also include another component, for example, a conductive material or an intermediate layer with the base layer, the electrode layer, and the encapsulating structure as long as the optical functional layer is not exposed to an external environment. For example, in FIG. 9 or 10, another component may be located in a part in which the base layer 101 is in contact with the electrode layer 102 or in which the first electrode layer 102 is in contact with the encapsulating structure 903 or 1001, or at another position. As the component, an organic material, inorganic material, or organic/inorganic combination material having low moisture permeability, or an insulating layer or an auxiliary electrode may be used.

Still another aspect of the present application provides a method of manufacturing a substrate for an OED or an OED. The illustrative method may include forming an optical functional layer on a base layer, and here, the optical functional layer is processed to have a smaller projected area than that of base layer. Such a process may be performed, for example, by removing at least a part of the optical functional layer formed on the base layer. The optical functional layer may be patterned to be located only at a position corresponding to an emitting region as described above through the above processing.

For example, as shown in FIG. 11, a part of an optical functional layer 103 formed on an entire surface of a base layer 101 may be removed. A method of forming the optical functional layer on the base layer is not particularly limited, and thus a conventional method according to an aspect of the optical functional layer is applied. For example, the optical functional layer may be formed by the above-described coating method, a deposition method such as chemical vapor deposition (CVD) or physical vapor deposition (PVD), nano imprinting or microembossing.

A method of removing a part of the optical functional layer formed on the base layer is not particularly limited, and a suitable method may be applied in consideration of the kind of optical functional layer.

For example, the optical functional layer may be removed by applying wet or dry etching in which the optical functional layer is treated with an etching solution capable of dissolving the optical functional layer.

In another embodiment, the optical functional layer may be removed by laser processing. For example, after the optical functional layer is formed on the base layer, it may be removed by radiating a laser. The laser may be radiated to a side on which the optical functional layer is formed, or when the base layer is transparent, to the base layer. Any kind of laser having a suitable output and capable of removing the optical functional layer may be used. The laser may be, for example, a fiber diode laser, a solid laser such as ruby (e.g., $Cr^{3+}:Al_2O_3$) or YAG ($Nd^{3+}:Y_3Al_5O_{12}$), a gas laser such as phosphate glass, silicate glass, a $CO_2$ laser, or an excimer laser, a liquid laser, a semiconductor laser, or YLF($Nd^{3+}:LiYF_4$). Such a laser may be radiated in the form of a spot laser or a line beam laser. A condition of radiating a laser is not particularly limited as long as it is controlled to perform suitable processing. For example, a laser having a wavelength in the UV or IR range may be radiated with an output of approximately 1 to 10 W, but the present application is not limited thereto.

The optical functional layer may also be removed by a water jet method. The water jet method is a method for removing a target by shooting water at a predetermined pressure. For example, the optical functional layer may be removed by shooting water at a pressure of approximately 500 to 2000, or 800 to 1300 atm. For efficient removal, the above pressurized water that is shot may further include an abrasive. In consideration of a target to be removed, as the abrasive, a suitable one of known materials may be used at a suitable ratio.

When the water jet method is applied, a shooting diameter or speed may be selected in consideration of a part or pattern to be removed without particular limitation. For example, during the water jet process, a shooting width may be controlled to be approximately 1 to 10, or 2 to 5 nm. In addition, a speed of etching through the water jet may be, for example, approximately 300 to 2000, or 500 to 1200 mm/min, and thus suitable process efficiency is ensured and effective removal is performed.

As another method, removing a part of the optical functional layer by photolithography, or forming the optical functional layer to have a smaller projected area than that of base layer from the beginning by off-set printing or one of other pattern printing methods may be considered.

The type of processing of the optical functional layer may be changed according to purpose without particular limitation. For example, the processing may be performed such that a position of the optical functional layer having a smaller projected area than that of base layer corresponds to the emitting region of the emitting layer to be formed later, and the projected area corresponds to or is larger than that of the emitting layer or the emitting region formed by the emitting layer. Alternatively, when necessary, the optical functional layer may be processed in various patterns. In addition, the optical functional layer located in a part corresponding to a region to which an adhesive is applied to be adhered to the encapsulating structure or a terminal region of the device or a stacked structure of an optical functional layer and a planarized layer, may be removed.

The method may further include forming an electrode layer after the optical functional layer is processed. In this case, the electrode layer may have the above-described projected area, and may be formed at the above-described position. A sealing structure for sealing the optical functional layer processed along with the base layer may be formed. A method of forming the electrode layer may be performed by an arbitrary known method such as deposition, sputtering, CVD or PVD without particular limitation.

The method may further include forming the above-described intermediate layer. For example, the intermediate layer may be formed by the following method. For example, the intermediate layer may be formed by forming a layer of a material for forming the intermediate layer, for example, a material having an absolute value of a difference in refractive index from the electrode layer of approximately 1, 0.7, 0.5, or 0.3 or less, such as SiON, after the optical functional layer is processed to have a smaller projected area than that of base layer, and forming the electrode layer. In this case, the layer of the material for forming the intermediate layer may be formed by a conventional deposition method according to the material used therein. The layer may have a larger projected area than that of optical functional layer as described above, and may be formed on both the top of the optical functional layer and the top of the base layer on which the optical functional layer is not formed. In another embodiment, the intermediate layer may be formed by the following method. That is, the substrate for an OED including the intermediate layer may be formed by forming the optical functional layer on the base layer, forming an intermediate layer on the optical functional layer by the above-described method, removing the formed intermediate layer along with the optical functional layer such that the projected areas of the optical functional layer and the intermediate layer are smaller than that of the base layer, and additionally forming the intermediate layer on the top of the remaining intermediate layer which is formed on the base layer and the optical functional layer. Afterward, the electrode layer is formed on the top of the intermediate layer by the above-described method, thereby completing the substrate.

The method may include forming an organic layer including an emitting layer and a second electrode layer after the electrode layer is formed, and further forming an encapsulating structure. In this case, the organic layer, the second electrode layer and the encapsulating structure may be formed by known methods.

Yet another aspect of the present application provides a use of the organic electronic system, for example, the organic light emitting system. The organic light emitting system may be effectively applied to a backlight of a liquid crystal display (LCD), lightings, various kinds of sensors, printers, a light source of a copy machine, a light source for an automobile gauge, a signal light, a pilot lamp, a display device, a light source for a planar emitting device, a display, decorations or other kinds of lights. In one embodiment, the present application relates to a lighting device including the OLED. When the OLED is applied to the lighting device or for different uses, other components constituting the device and a method of constituting the device are not particularly limited, but all of optional materials or methods known in the related art may be employed as long as these are used in the OLED.

EFFECT

A substrate for an OED of the present application can be increased in durability by preventing penetration of an external material such as moisture or oxygen, and thus an organic electronic system having excellent light extraction efficiency can be formed. In addition, since the substrate can be stably attached to an encapsulating structure sealing the organic electronic system, a device can have excellent durability with respect to abrasion of an electrode layer or pressure applied from an external environment. In addition, surface hardness of an external terminal of the organic electronic system can be maintained at a suitable level.

EXPLANATIONS OF THE MARKS

Figure 1:
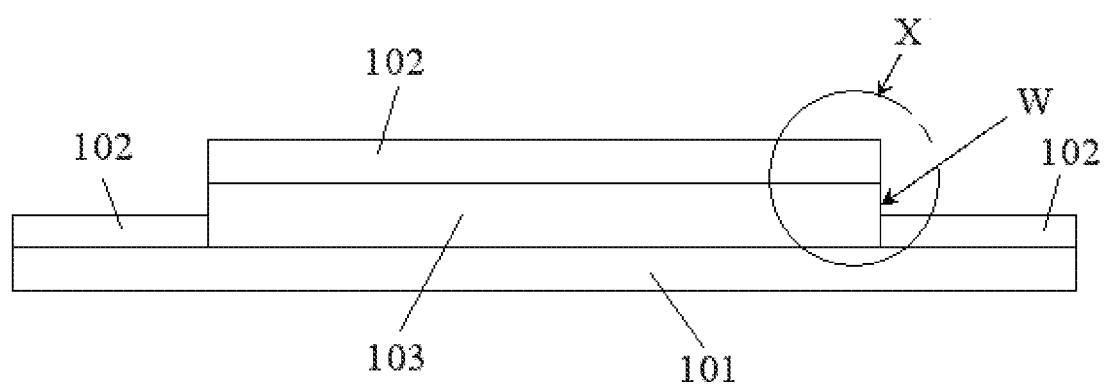
FIGS. 1 to 3 are schematic diagrams of illustrative substrates.
Figure 2:
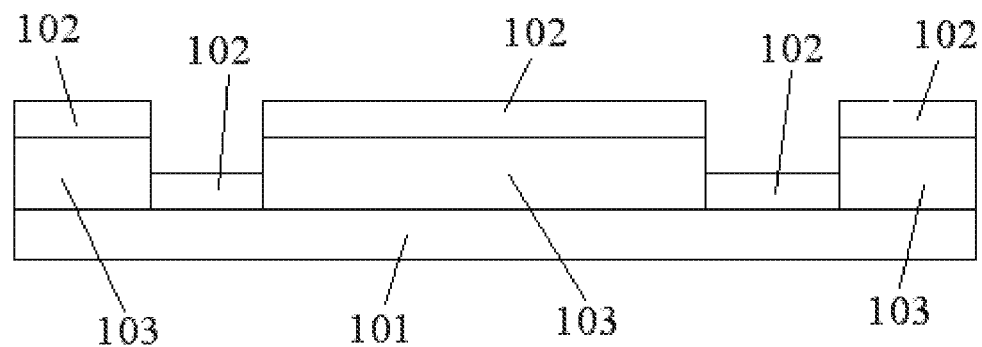
Figure 3:
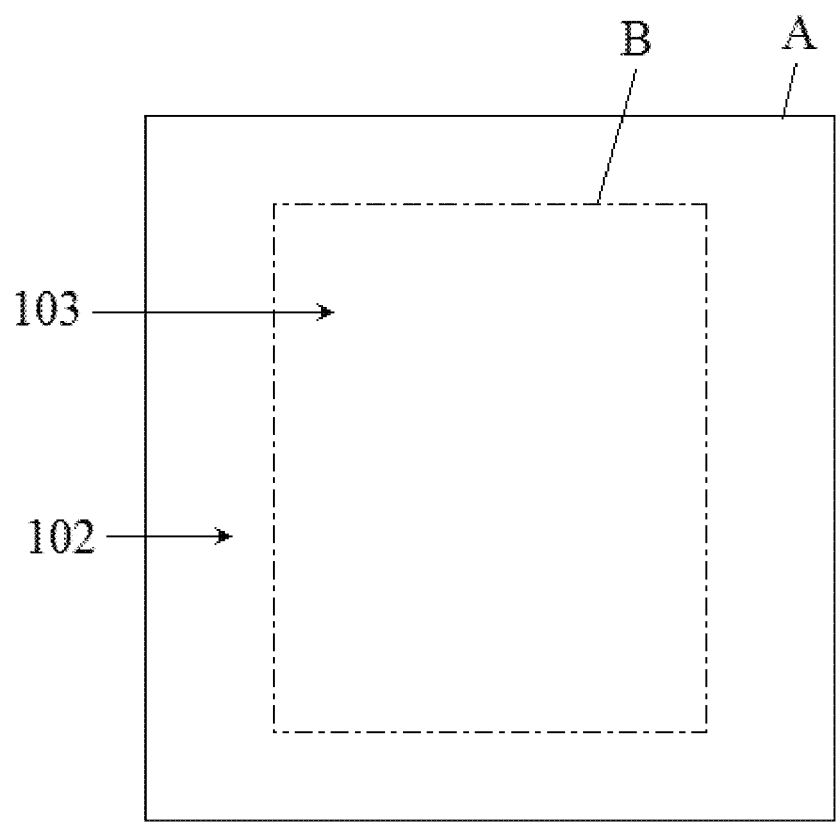
Figure 4:
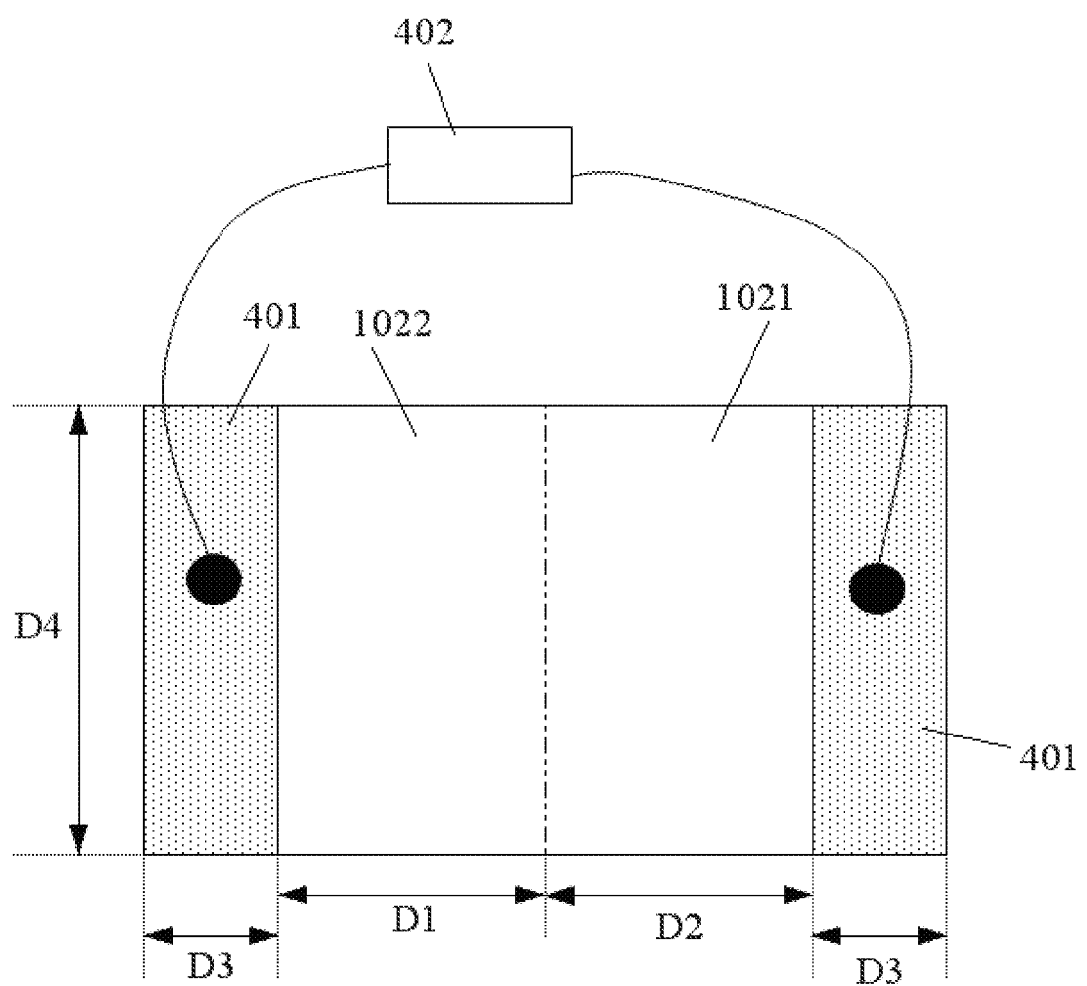
FIG. 4 is a diagram for explaining a method of measuring resistivity between electrode layers.
Figure 5:
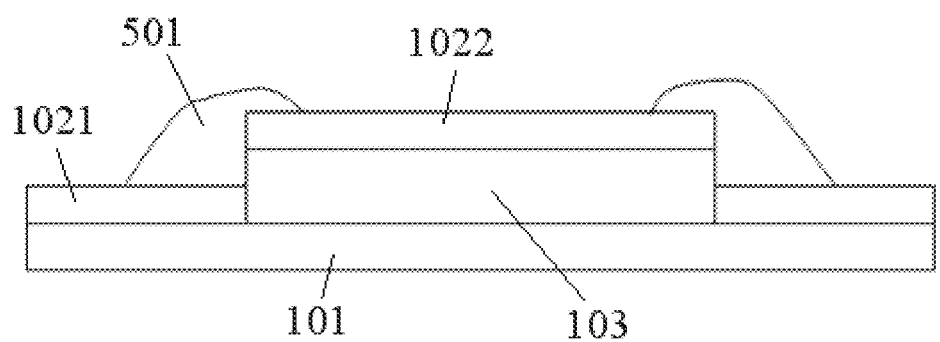
FIGS. 5 and 6 are schematic diagrams of illustrative substrates.
Figure 6:
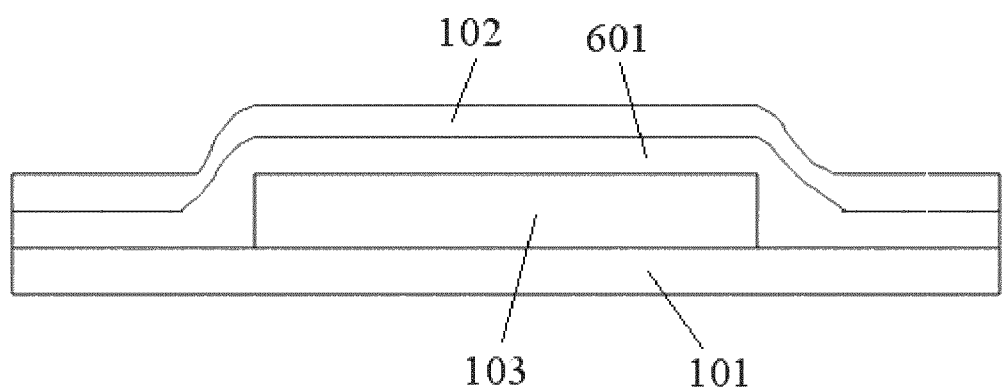
Figure 7:
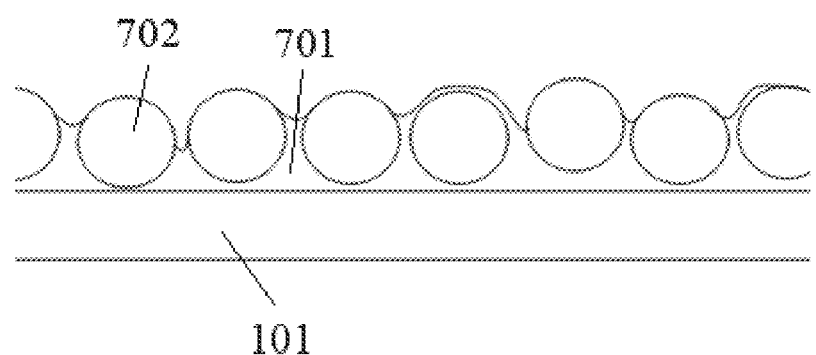
FIGS. 7 and 8 are diagrams of illustrative optical functional layers.
Figure 8:
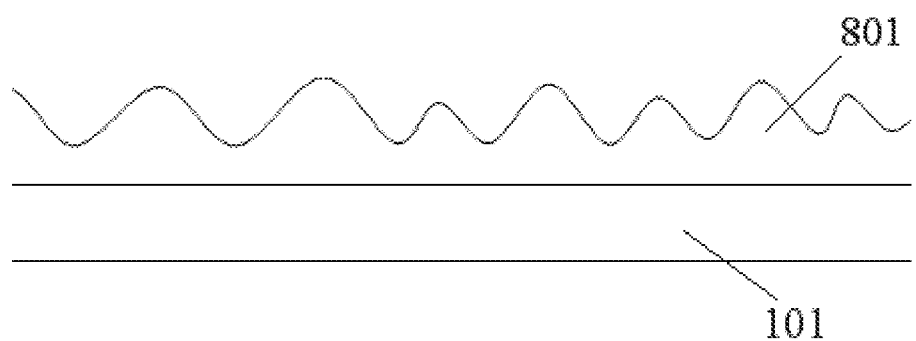

101: the base layer
102, 1021, 1022: the electrode layer
X: the boundary between the electrode layer on the base layer and the electrode layer on the optical functional layer
W: the side wall of the optical functional layer
A: the projected area of the electrode layer
B: the projected area of the optical functional layer
401: the silver paste
402: the measurer D1, D2, D3, D4: the dimension of the sample for measuring the resistivity or the silver paste
501: the conductive material
601: the intermediate layer
701: the matrix material
702: the scattering region
801: the light scattering layer
901: the organic layer
902: the second electrode layer
903, 1001: the encapsulating structure
904: the adhesive
1002: the upper substrate

DETAILED DESCRIPTION OF ILLUSTRATIVE EMBODIMENTS

Hereinafter, illustrative embodiments of the present application will be described in detail. However, the present application is not limited to the embodiments disclosed below.

Example 1

Figure 9:
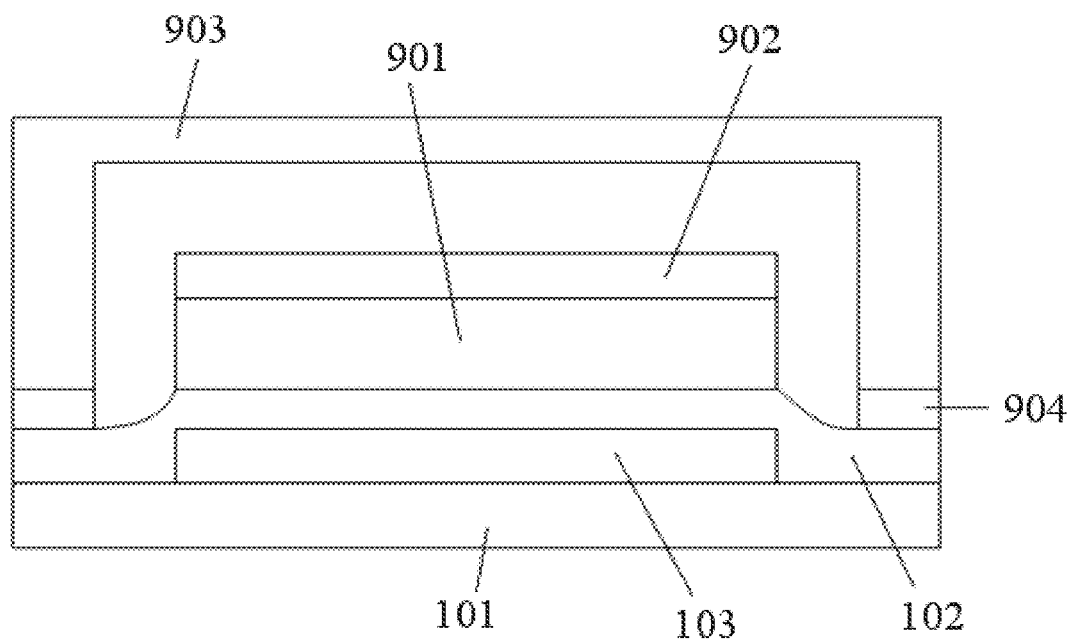
FIGS. 9 and 10 are diagrams of illustrative organic electronic systems.
Figure 10:
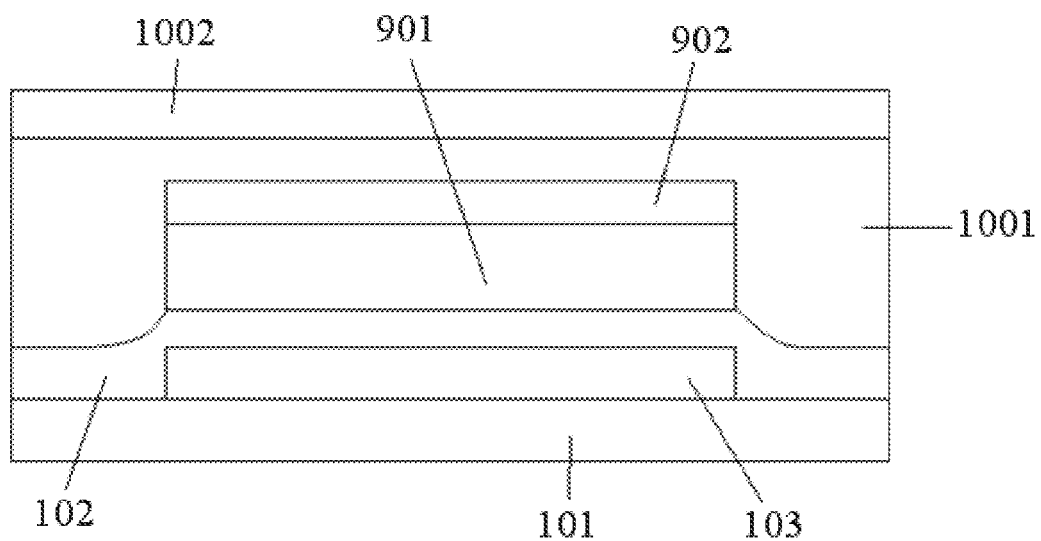
Figure 11:
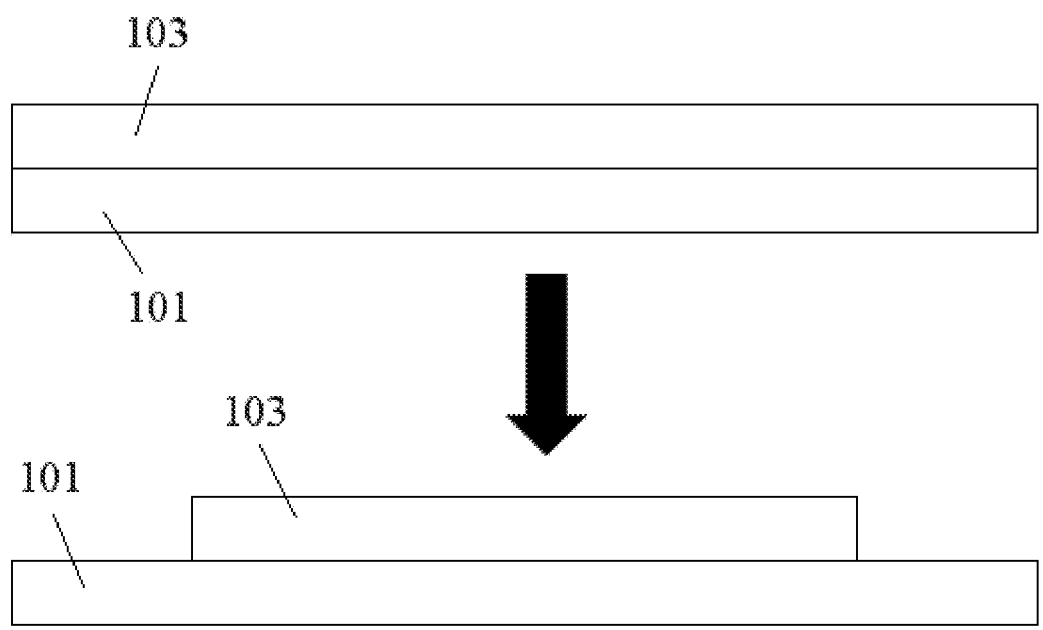
FIG. 11 is a diagram for explaining a process of manufacturing an illustrative substrate.

A coating solution for a light scattering layer was prepared by blending and sufficiently dispersing scattering particles (titanium oxide particles) having an average diameter of approximately 200 nm in a sol-gel coating solution including tetramethoxy silane as a condensable silane. A light scattering layer was formed to have a thickness of approximately 300 nm by coating the coating solution on a glass surface, and performing a sol-gel reaction at 200° C. for approximately 30 minutes. Afterward, a planarized layer having a refractive index of approximately 1.8 and a thickness of approximately 300 nm was formed by coating a highly refractive coating solution prepared by blending highly refractive titanium oxide particles having an average diameter of approximately 10 nm and a refractive index of approximately 2.5 in asol-gel coating solution including tetramethoxy silane in the same manner as described above on the top of the light scattering layer, and performing a sol-gel reaction in the same manner as described above. Subsequently, SiON was further deposited to a thickness of approximately 50 nm on an entire surface of the planarized layer. Afterward, the light scattering layer and the planarized layer were partially removed by radiating a laser to the formed layer such that positions of the remaining light scattering layer and the planarized layer corresponded to an emitting region of an organic layer to be subsequently formed. After the removal, the processed stacked structure was washed with deionized water (DI). Subsequently, SiON was deposited again to a thickness of approximately 50 nm on an entire surface of a substrate, and an ITO transparent electrode layer was formed on the entire surface of the substrate by a conventional method, thereby manufacturing the substrate. In addition, a hole injection layer, a hole transport layer, an emitting layer, an electron transport layer, an electron injection layer and an electron injection electrode layer were formed using known materials and methods. Afterward, an organic light emitting system having the encapsulating structure shown in FIG. 9 was manufactured using a glass can.

Comparative Example 1

An organic light emitting device was manufactured as described in Example 1, except that an ITO electrode layer was formed without removal of a light scattering layer and a planarized layer, which were formed on an entire surface of a glass substrate, and an organic layer, a second electrode layer and an encapsulating structure were sequentially formed.

Comparative Example 2

An organic light emitting system was manufactured as described in Example 1, except that the forming of a SiON layer in the manufacturing process was not performed.

Experimental Example 1

Measurement of Emitting State

Figure 12:
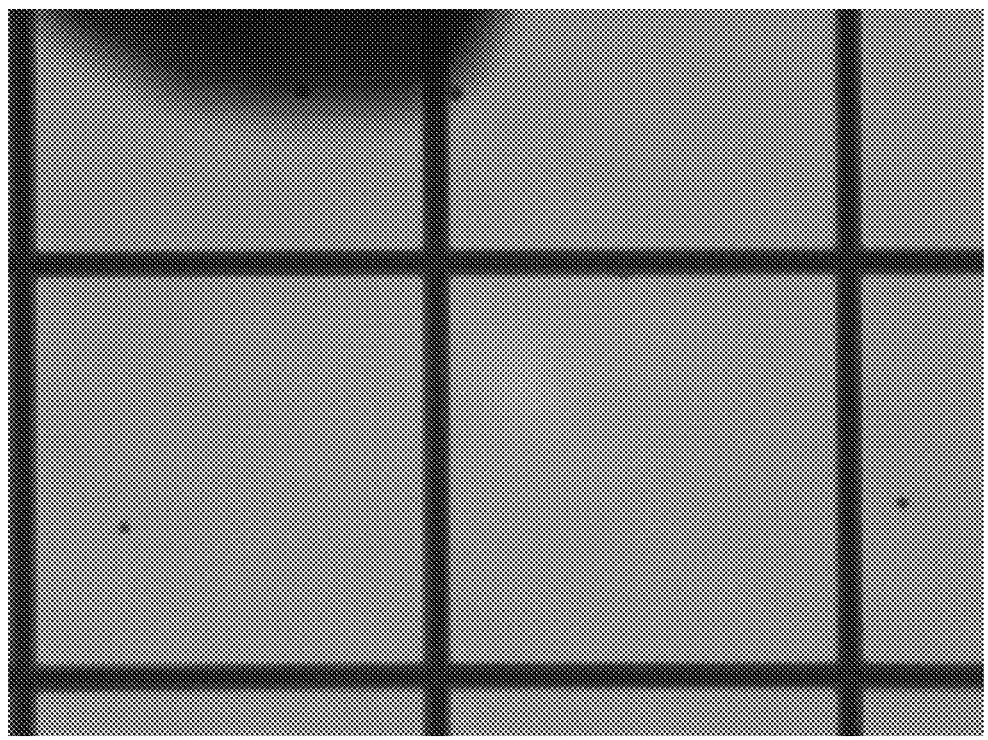
FIG. 12 is an image showing evaluation of durability of an OLED according to Example 1.
Figure 13:
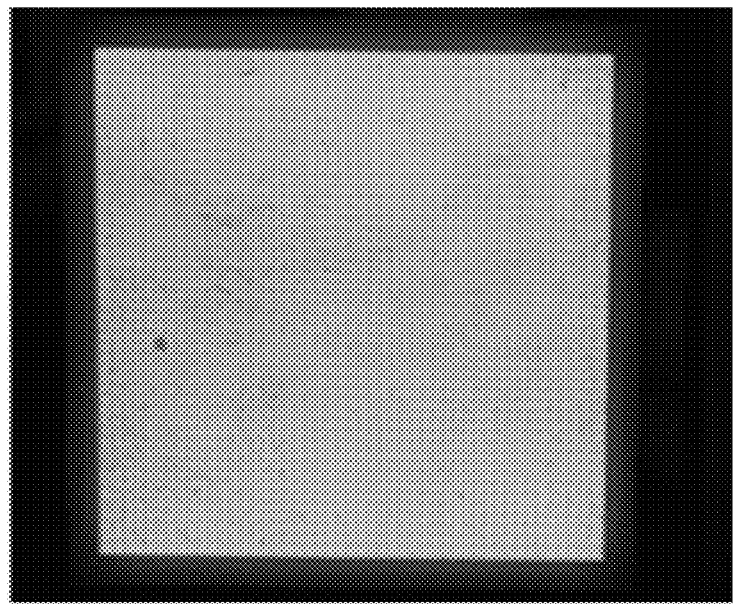
FIG. 13 is an image showing evaluation of durability of an OLED according to Comparative Example 1.
Figure 13:

Durability was evaluated by observing an initial emitting state of the organic light emitting system according to Example or Comparative Example, maintaining the OLED at 85° C. for 500 hours, and measuring an emitting state again. FIG. 12 is a diagram showing an emitting state after the system manufactured in Example 1 was maintained at 85° C. for 500 hours, and FIG. 13 shows an initial emitting state of Comparative Example 1 (FIG. 13(A)) and an emitting state after the device was maintained at 85° C. for 500 hours (FIG. 13(B)). From the drawings, it was confirmed that uniformity in luminescence considerably decreased since there were great amounts of dark spots in Comparative Example 1 after 500 hours.

Experimental Example 2

Examination of Effect According to Formation of Intermediate Layer

Figure 14:
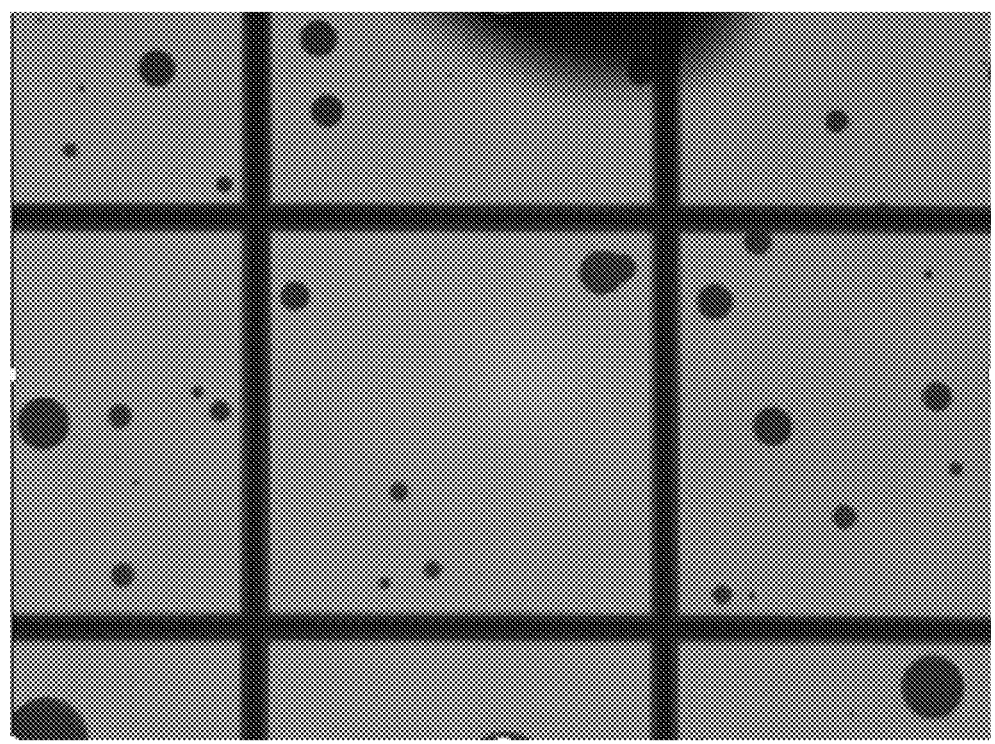
FIG. 14 is an image showing results obtained by evaluating an OLED according to Comparative Example 2.

FIG. 14 shows results obtained by confirming an emitting state of the system manufactured in Comparative Example 2. Compared to FIG. 12 showing the results of confirming an emitting state in Example, it was confirmed that great amounts of dark spots were bound to the device. It was also confirmed that a drive voltage of the device of Comparative Example 2 was increased by approximately 0.1 to 0.2 V, compared to that of the device of Comparative Example 1.

What is claimed is:

1. A substrate for an organic electronic device, comprising:
a base layer comprising a non-conductive material;
an optical functional layer that is formed on and in direct contact with the non-conductive material of the base layer and has a smaller projected area than the base layer;
an intermediate insulation layer that has a larger projected area than the optical functional layer, that is formed on and in direct contact with both the optical functional layer and the base layer on which the optical functional layer is not formed; and
an electrode layer that is formed on and in direct contact with the intermediate insulation layer, that has an absolute value of a difference in refractive index from the intermediate insulation layer of 1 or less, that has a larger projected area than the optical functional layer, and that is formed on both the optical functional layer and the base layer on which the optical functional layer is not formed,
wherein the optical functional layer is a light scattering layer comprising a matrix material and scattering particles having a different refractive index from that of the matrix material.

2. The substrate according to claim 1, wherein a ratio (A/B) of a projected area (A) of the electrode layer relative to a projected area (B) of the optical functional layer is 1.04 or more.

3. The substrate according to claim 1, wherein the intermediate insulation layer comprises SiON, $TiO_2$, $SiO_2$, $Al_2O_3$, $Ta_2O_3$, $Ti_3O_3$, TiO, $ZrO_2$, $Nb_2O_3$, $CeO_2$ or ZnS.

4. The substrate according to claim 1, wherein the intermediate insulation layer has a thickness of 10 to 100 nm.

5. The substrate according to claim 1, wherein the base layer is transparent.

6. The substrate according to claim 1, wherein the electrode layer is a hole injection electrode layer or an electron injection electrode layer.

7. The substrate according to claim 1, wherein the optical functional layer further comprises a planarized layer formed on the light scattering layer.

8. The substrate according to claim 7, wherein the planarized layer has a refractive index of 1.7 or more.

9. An organic electronic system, comprising:
a substrate for an organic electronic device, comprising: a base layer; an optical functional layer that is formed on the base layer and has a smaller projected area than the base layer; an intermediate insulation layer that has a larger projected area than the optical functional layer, that is formed on and in direct contact with both the optical functional layer and the base layer on which the optical functional layer is not formed; and
a first electrode layer that is formed on and in direct contact with the intermediate insulation layer, that has an absolute value of a difference in refractive index from the intermediate insulation layer of 1 or less, that has a larger projected area than the optical functional layer, and that is formed on both the optical functional layer and the base layer on which the optical functional layer is not formed;
an organic layer that comprises an emitting layer and that is formed on the first electrode layer of the substrate; and
a second electrode layer formed on the organic layer,
wherein the optical functional layer is a light scattering layer comprising a matrix material and scattering particles having a different refractive index from that of the matrix material.

10. The system according to claim 9, wherein a difference (B-C) between a length (B) of a region in which the optical functional layer of the substrate is formed and a length (C) of the emitting region of the emitting layer is from 10 μm to 2 mm.

11. The system according to claim 9, further comprising an encapsulating structure for protecting the organic layer and the second electrode layer, which is attached to the top surface of the first electrode layer of the substrate, below which the optical functional layer is not formed.

12. The system according to claim 11, wherein the encapsulating structure is a glass can or a metal can, or a film covering entire surfaces of the organic layer and the second electrode layer.

13. Lighting comprising the organic electronic system of claim 9.

14. A method of manufacturing a substrate for an OED, comprising: forming an optical functional layer on a base layer to have a smaller projected area than the base layer; forming an intermediate insulation layer having a larger projected area than the optical functional layer on and in direct contact with both the optical functional layer and the base layer on which the optical functional layer is not formed, and; and forming an electrode layer having a difference in refractive index from the intermediate insulation layer of 1 or less, on and in direct contact with the intermediate insulation layer, and on both the optical functional layer and the base layer on which the optical functional layer is not formed to have a larger projected area than the optical functional layer, wherein the optical functional layer is a light scattering layer comprising a matrix material and scattering particles having a different refractive index from that of the matrix material, and wherein the base layer comprises a non-conductive material, and the optical functional layer is in direct contact with the non-conductive material of the base layer.

15. The method according to claim 14, wherein the forming of the optical functional layer and the intermediate insulation layer comprises sequentially forming the optical functional layer and the intermediate insulation layer on the base layer, processing the optical functional layer and the intermediate insulation layer to have a smaller projected area than that of the base layer, and further forming the intermediate insulation layer on both of the processed optical functional layer and intermediate insulation layer and the base layer on which the optical functional layer and intermediate insulation layer are not formed.

\* \* \* \* \*